(12) United States Patent
Matsui (10) Patent No.: US 12,381,371 B2
(45) Date of Patent: Aug. 5, 2025

(54) DFB+R LASER STRUCTURE FOR DIRECTLY MODULATED LASER

(71) Applicant: II-VI Delaware, Inc., Wilmington, DE (US)

(72) Inventor: Yasuhiro Matsui, Milpitas, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 699 days.

(21) Appl. No.: 17/804,448

(22) Filed: May 27, 2022

(65) Prior Publication Data

US 2022/0393427 A1   Dec. 8, 2022

Related U.S. Application Data

(60) Provisional application No. 63/196,841, filed on Jun. 4, 2021.

(51) Int. Cl.
*H01S 5/068* (2006.01)
*H01S 5/028* (2006.01)
*H01S 5/042* (2006.01)
*H01S 5/0683* (2006.01)
*H01S 5/125* (2006.01)

(52) U.S. Cl.
CPC .......... *H01S 5/0427* (2013.01); *H01S 5/0287* (2013.01); *H01S 5/0683* (2013.01); *H01S 5/125* (2013.01)

(58) Field of Classification Search
CPC ................................................. H01S 5/06832
See application file for complete search history.

(56) References Cited

U.S. PATENT DOCUMENTS

| 11,251,585 | B2 | 2/2022 | Matsui | |
| 2019/0097385 | A1* | 3/2019 | Blauvelt | H01S 5/0085 |
| 2022/0140569 | A1 | 5/2022 | Matsui | |

* cited by examiner

*Primary Examiner* — Minsun O Harvey
*Assistant Examiner* — Stephen Sutton Kotter
(74) *Attorney, Agent, or Firm* — Blank Rome LLP (57) ABSTRACT

A controller stabilizes a distributed feedback plus reflection (DFB+R) laser, which has a back facet, a DFB section, a passive section, and a front facet with a low reflective element. An etalon filter is formed by a portion of the DFB section, the passive section, and the low reflective element. Control circuitry directly modulates the DFB section with a modulation signal and biases the passive section with a bias signal. In operation, a lasing mode of the DFB section is aligned to a long wavelength edge of one of the periodic peaks of a reflection profile of the etalon filter. Meanwhile, photodiodes are arranged to monitor the output power emitted from the laser's front and back facets. The control circuitry monitors a ratio of the detected output power and adjusts the bias based on the monitored ratio.

22 Claims, 4 Drawing Sheets

DFB+R LASER STRUCTURE FOR DIRECTLY MODULATED LASER

CROSS-REFERENCE TO RELATED APPLICATIONS

This application claims the benefit of U.S. Provisional Appl. No. 63/196,841 filed Jun. 4, 2021, which is incorporated herein by reference in its entirety.

FIELD OF THE DISCLOSURE

The subject matter of the present disclosure is directed to stabilizing the operation of a distributed feedback (DFB) laser having weak optical feedback (i.e., DFB plus reflection (DFB+R) laser) over its life. Moreover, the subject matter is directed to securing a stable high-speed operation even when the DFB+R laser shows degradation due to aging or high-temperature operation.

BACKGROUND OF THE DISCLOSURE

Lasers are useful in several applications. For example, lasers may be used in optical communications to transmit digital data across a fiber-optic network. The laser may be modulated by a modulation signal, such as an electronic digital signal, to produce an optical signal transmitted on a fiber optic cable. An optically sensitive device, such as a photodiode, is used to convert the optical signal to an electronic digital signal transmitted through the fiber-optic network. Such fiber optic networks enable modern computing devices to communicate at high speeds and over long distances.

In various industries, bitrates for data transmission per channel have surpassed 100 gigabits per second (Gb/s), establishing transmitter performance exceeding 60 gigahertz (GHz) bandwidth (BW) as an industry goal for the 100 Gb/s non-return-to-zero (NRZ) format. Although some electro-absorption modulators have exhibited the capability to approach 60 GHz BW, the BW of directly modulated lasers (DML), such as directly modulated DFB lasers have lagged behind at approximately 30 GHz.

One type of laser used is a distributed feedback (DFB) laser having weak optical feedback. This type of laser is referred to as a DFB plus reflection (DFB+R) laser. The DFB+R laser can leverage a detuned-loading effect to improve the performance of the DFB laser by including a passive section with weak optical feedback in the DFB laser. Examples of DFB+R lasers configured to leverage the detuned-loading effect are disclosed in U.S. Pat. No. 11,251,585 and disclosed in co-pending U.S. application Ser. No. 17/647,227, which are incorporated herein by reference in their entireties.

A bandwidth (BW) of 75 GHz has been demonstrated for a DFB+R laser. Such a wide modulation BW is obtained when the DFB+R laser is biased slightly below a kink in the light-current curve, caused by a mode hop. However, improper control of the DFB+R laser can be detrimental to its operation. In the end, stable operation of the DFB+R laser over its life is desired so high-speed operation can be achieved even when the DFB+R laser shows degradation due to aging or high-temperature operation.

The subject matter of the present disclosure is directed to overcoming, or at least reducing the effects of, one or more of the problems set forth above.

SUMMARY OF THE DISCLOSURE

A controller, such as an automatic power control, is disclosed for use with a distributed feedback plus reflection (DFB+R) laser. The DFB+R laser has a back facet, a DFB section, a passive section, and a front facet. The passive section, a portion of the DFB section, and the front facet form an etalon filter. The controller comprises first and second photodiodes and control circuitry. The first photodiode is arranged to monitor the first output power emitted from the front facet of the DFB+R laser, and the second photodiode is arranged to monitor the second output power emitted from the back facet of the DFB+R laser. The control circuitry is in electrical communication with the first and second photodiodes and with the DFB+R laser. The control circuitry is configured to: directly modulate the DFB section; bias the passive section; monitor a ratio of the first output power relative to the second output power; and adjust the bias based on the monitored ratio.

A system is also disclosed herein comprising a DFB+R laser, first and second photodiodes, and control circuitry, such as described above.

A method disclosed herein comprises directly modulating a DFB+R laser; measuring the first output power emitted from a front facet of the DFB+R laser; measuring the second output power emitted from a back facet of the DFB+R laser; monitoring a ratio of the first output power relative to the second output power; and adjusting bias to the DFB+R laser based on the monitored ratio.

The foregoing summary is not intended to summarize each potential embodiment or every aspect of the present disclosure.

DETAILED DESCRIPTION OF THE DISCLOSURE

As noted, a bandwidth (BW) of 75 GHz has been demonstrated for a DFB+R laser. Such a wide modulation BW can be obtained when the DFB+R laser is biased by a bias current slightly below a kink in a light-current curve, caused by a mode hop condition. To guarantee a stable operation over the life of a DFB+R laser after aging over time or after operating over a wide operating temperature range, the system of the present disclosure uses two photodiodes (PD's) to monitor both front and back output powers emitted from the DFB+R laser. A ratio of the monitored output powers from the two monitor photodiodes is determined during operation. To increase the long-term stability of the DFB+R laser, the monitored ratio can be maintained by adjusting a bias current for the DFB+R laser.

Figure 1:
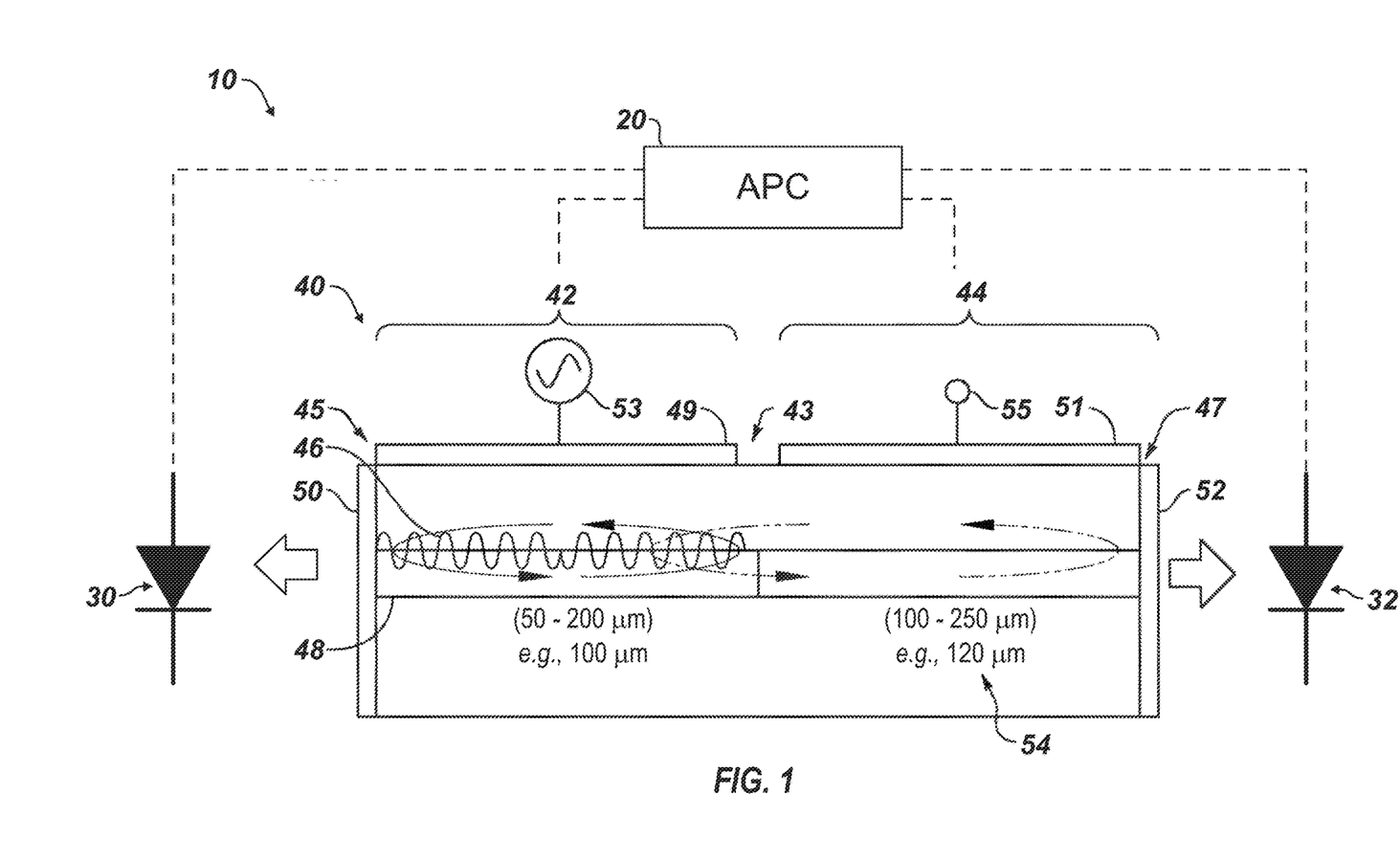
FIG. 1 illustrates a system according to the present disclosure having a DFB+R laser, monitoring photodiodes, and control circuitry.

FIG. 1 illustrates a system 10 according to the present disclosure having a DFB+R laser 40, monitoring photodiodes 30, 32, and control circuitry 20.

The DFB+R laser 40 includes a DFB section 42 (also referred to as an active section) and a passive section 44. The passive section 44 is coupled to a front 43 of the DFB section 42. The DFB section 42 may have a length in a range from 50 μm to 200 μm, such as 80 or 100 μm, and the passive section 44 may have a length in a range from 100 μm to 250 μm (microns or micrometers), such as 120 μm. Other arrangements can be used. For example, the DFB section 42 may have a length between 60 to 150 microns, and the passive section 44 can have a length between 30 to 80 microns.

The DFB section 42 includes a DFB grating 46 formed in, on, or above an MQW gain layer 48 or another suitable gain layer. The DFB grating 46 can include first and second grating portions with a phase shift in between. An HR element 50 having high reflectivity is formed at or on a rear or back (e.g., on back facet 45) of the DFB section 42. Meanwhile, a low reflection (LR) element 52 is formed at or on a front (e.g., on a front facet 47) of the passive section 44.

In general, the HR element 50 can include: an HR mirror having a reflectivity of 30% or more; an HR mirror coupled to or formed at the rear of the DFB section 42, an HR coating formed on the back facet 45 of the DFB+R laser 40; an HR distributed Bragg reflector (DBR) mirror; or the like. For its part, the LR element 52 can include: an LR mirror having a reflectivity of 15% or less; an LR mirror formed at a front of the passive section 44; an LR coating formed on the front facet 47 of the DFB+R laser 40; or the like. In one suitable configuration, the LR element 52 has a reflectivity of about 3%.

An etalon filter 54 is formed between a portion of the DFB grating 46 at the front of the DFB section 42 and the LR element 52. The DFB laser 40 forms a complex-cavity design consisting of a DFB laser itself (e.g., the DFB section 42) and the etalon filter 54. This etalon filter 54 is configured to modify cavity loss dynamically due to frequency chirp as the DFB section 42 is modulated.

The DFB+R laser 40 additionally includes a modulation contact 49 and a bias contact 51 electrically coupled to, respectively, the DFB section 42 and the passive section 44. In general, the DFB+R laser 40 of FIG. 1 can be used for 200 G-400 G applications under cooled conditions and can achieve about 60 GHz BW or more. For example, the DFB+R laser 40 can have a passive waveguide length of about 120 μm integrated with the LR element 52 with a reflection of about 3% on the front facet 47 to produce the detuned-loading effect. This arrangement can enhance the detuned-loading effect for the resonance frequency Fr to about 40 GHz and can produce a photon-photon resonance (PPR) effect at about 70 GHz, realizing about 75 GHz bandwidth (BW).

The control circuitry 20 includes features for automatic power control (APC) to operate the DFB+R laser 40. As will be appreciated, the control circuitry 20 can comprise (or can be part of) a controller typically used to operate a DFB+R laser. In general, the control circuitry 20 can include conventional circuit components, integrated circuits, laser drivers, amplifiers, modulation current controllers, bias current controllers, processors, comparator circuits, and the like, such as used in the industry.

The control circuitry 20 is in electrical communication with the modulation contact 53 coupled to the DFB section 42 of the DFB+R laser 40. The control circuitry 20 is configured to provide a modulation signal to the DFB section 42 to modulate the DFB section 42 and drive the laser 40. The modulation of the DFB section 42 is configured to modulate cavity loss of the DFB+R laser 40 and can be configured to increase a carrier-photon resonance frequency (Fr) of the DFB+R laser 40.

Additionally, the control circuitry 20 is in electrical communication to the bias contact 55 coupled to the passive section 44 of the DFB laser 40. The control circuitry 20 is configured to provide a bias signal to the passive section 44. To achieve the wide modulation bandwidth desired as noted herein, the bias signal preferably biases the DFB+R laser 40 slightly below a kink in a light-current curve caused by a mode hop in a manner discussed in more detail below.

Meanwhile, the control circuitry 20 is also in electrical communication with the photodiodes 30, 32, which are arranged to monitor the output power emitted respectively from the back and front facets 45, 47 of the DFB+R laser 40. The photodiodes 30, 32 can be optically coupled to the facets 45, 47 in a known manner. As will be appreciated, the optical power emitted from the back facet 45 is not typically used for an underlying optical device or operation so optically coupling the back photodiode 30 to the back facet 45 can be more direct. By contrast, the optical power emitted from the front facet 47 is used for the underlying optical device and operation. In this case, the optical coupling of the front photodiode 32 to the front facet 47 still allows the emitted optical power to be used for the underlying device and operation. Therefore, a splitter, waveguide, prism, grating, or another type of optical component (not shown) can be used to direct portions of the optical power to the front photodiode 32 and other elements of the underlying optical device. As will be appreciated, the optical power detected by the photodiodes 30, 32 may represent a portion of the power being output and emitted by the facets 45, 47 of the DFB+R laser 40. Nevertheless, the detected output powers can be compared relative to one another in a ratio or the like to characterize the operation of the DFB+R laser 40 in the manner disclosed herein.

Using the output powers detected by the photodiodes 30, 32, the control circuitry 20 compares the magnitudes of the output powers relative to one another. For example, the control circuitry 20 monitors a ratio of the output powers relative to one another so the ratio can be compared to a constant value, a threshold, and the like, or so the ratio can be monitored for changes over time. Based on the monitored ratio, the control circuitry 20 adjusts the bias signal provided to the DFB+R laser 40. As discussed in more detail below, the control circuitry 20 monitors the output power ratio to detect a mode position of the laser's etalon filter 46 so the mode can be stabilized by maintaining the ratio at a constant (or near-constant value). The stabilization provided by the disclosed system 10 can in turn improve the long-term stability of the DFB+R laser 40 and can keep the desired bias close to (but below) conditions that would cause a mode-hop.

To understand the control provided by the control circuitry 20 and the photodiodes 30, 32 of the system 10 to the DFB+R laser 40, the discussion turns to details related to the behavior of the intra-cavity etalon filter 54, light-current (L-I) characteristics, and MQW gain layer 48 of the DFB+R laser 40.

Figure 2A:
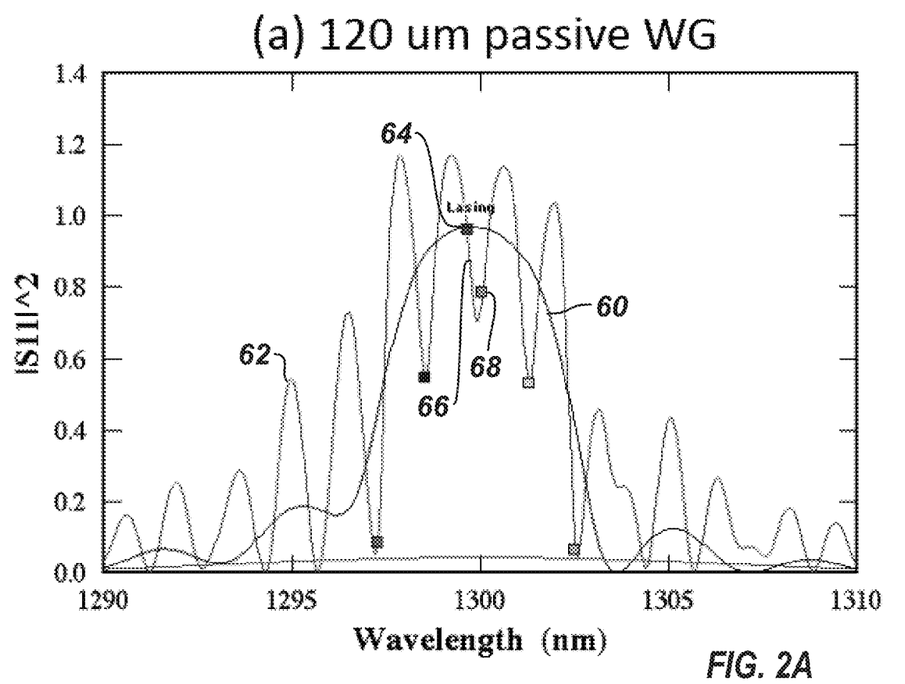
FIG. 2A illustrates a graph for a DFB+R intra-cavity etalon filter formed between the front facet and the DFB grating of the DFB+R laser.

For reference, FIG. 2A illustrates reflection profiles for the DFB+R laser (40) at different wavelengths. A reflection profile 60 is given for the DFB grating (46; FIG. 1) and shows the DFB stopband when there is no reflection. Another reflection profile 62 is given for the DFB+R intra-cavity etalon filter (54) of the DFB+R laser (40) of FIG. 1. The reflection profile 62 represents the reflection of the combined DFB grating (46) and the LR element (52) (with a reflectivity of 3%) so this profile 62 is referred to hereinafter as a combined DFB+R reflection profile 62 when seen from the DFB section (42) toward the output of the DFB+R laser (40).

As illustrated by the DFB+R reflection profile 62, the etalon filter (54) formed by the DFB grating (46) and the LR element (52) produces strong ripples and hence a strong detuned-loading effect. The reflection profile 62 has periodic peaks and valleys. Point 64 shows the location of a main lasing mode of the DFB section (46), and point 68 shows the location of a photon-photon resonance (PPR) mode. During operation, the control circuitry (20) is configured to operate the lasing mode 64 of the DFB section (46) in a mode position aligned to a long wavelength edge 66 of one of the periodic peaks of the reflection profile 62 of the etalon filter (54).

Figure 2B:
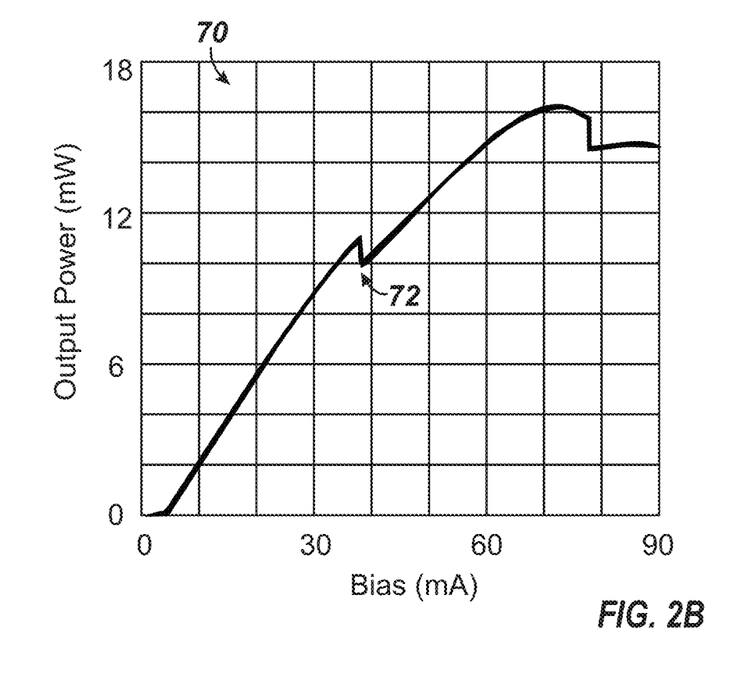
FIG. 2B illustrates measured light-bias characteristics of the DFB+R laser, having output power (mW) graphed relative to bias (mA).

The light-current (L-I) characteristic for a DFB+R laser typically includes kinks, which correspond to the mode hop behavior caused by the reflection on the front facet. For reference, FIG. 2B shows a light-current (L-I) curve 70 having output power (mW) graphed relative to bias (mA) for a typical DFB+R laser. The curve 70 includes kinks 72 that correspond to the mode hop behavior of the DFB laser caused by the reflection on the front facet. Typically two kinks 72 for two "mode hops" are present in the Light-Current (L-I) curve 70 for the operational range of the DFB+R laser. Because of this behavior, the bias signal provided by the control circuitry 20 to the DFB+R laser (40) of the present disclosure is chosen to prevent such mode hops.

As noted herein, the modulation BW of the DFB+R laser (40) is maximized when biased slightly below the kink 72. For this reason, stabilizing the bias of the DFB+R laser (40) over its life can be particularly beneficial. If the output power from only one facet (45, 47) is monitored and the bias current is adjusted based on just the one monitored output power over the life of the laser (40), there is a risk that the bias is changed across the kink bias condition, resulting in a mode hop.

As disclosed herein, however, the system 10 of FIG. 1 uses the control circuitry 20 and the back and front monitoring photodiodes 30, 32 to stabilize the operation of the DFB+R laser 40 over its life. Moreover, the system 10 is directed to securing a stable high-speed operation even when the DFB+R laser 40 shows degradation due to aging or high-temperature operation. To do this, the system 10 seeks to not change the bias across the kink bias condition to avoid producing a resulting mode hop.

Figure 3A:
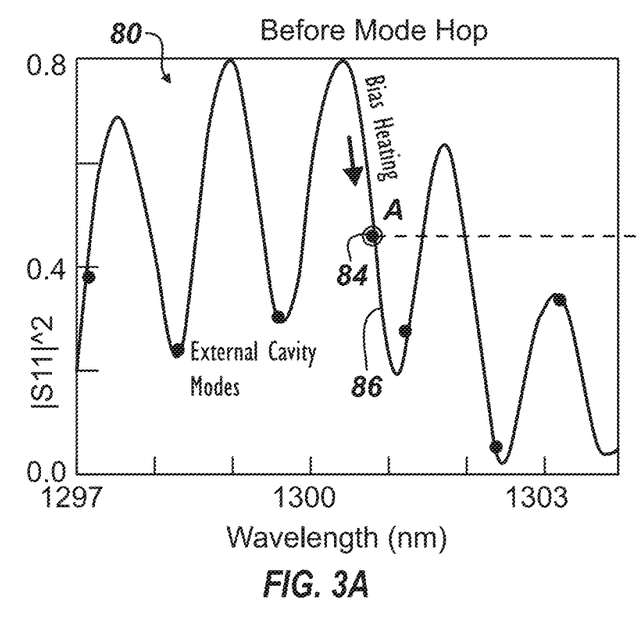
FIGS. 3A-3B illustrate a reflection profile for the in-cavity etalon filter formed between the front facet and the DFB grating of the DFB+R laser.
Figure 3B:
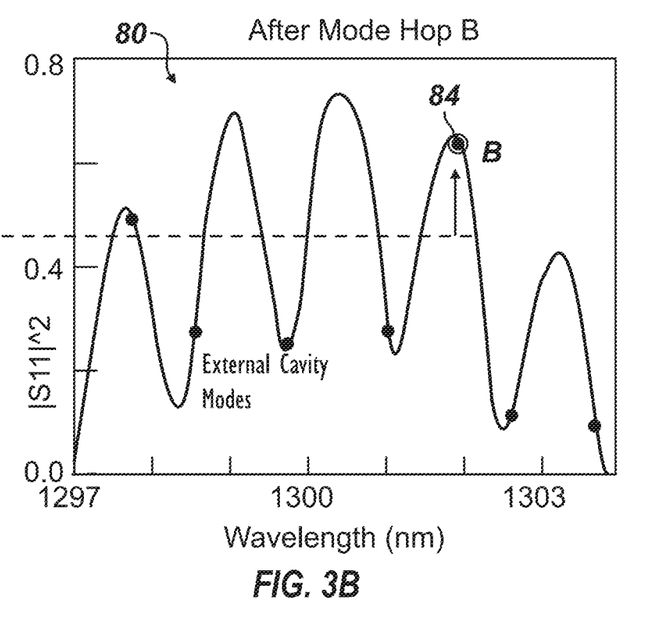

To understand the reasons for the mode hop and how the disclosed control circuitry 20 controls the DFB+R laser 40, FIGS. 3A-3B illustrate the reflection profile 80 for an in-cavity etalon filter (54) formed between the front facet (47) and the DFB grating (46) of the DFB+R laser (40). Again, in this example, the front facet (47) has a 3% reflective coating. The reflection profile 80 shows periodic peaks with a periodicity of about 1.4 nm, corresponding to a free spectral range (FSR) of the passive length of about 120 μm. When the gain bias is increased, the lasing mode 84 shifts toward the longer wavelength due to the Joule heating associated with the current injection, which increases the refractive index of the MQW gain layer (48) due to the thermo-optic effect.

As the reflection profile 80 in FIG. 3A shows, such a heating effect pushes the lasing mode 84 to the edge of the etalon filter (54), as the gain bias is increased, then eventually reaches to a point A. As noted herein, this mode position aligns the lasing mode 84 to a long wavelength edge 86 of one of the periodic peaks of the reflection profile 80 of the etalon filter (54) and maximizes the modulation BW due to the steep slope of the etalon filter's profile 80 that effectively enhances the differential gain. Simultaneously, isolator-free operation can be achieved at this mode position A.

When the bias is increased further as indicated in reflection profile 80 of FIG. 3B, the lasing mode 84 hops to another point B near the peak of the neighboring etalon peak in the profile 80. In particular, below the bias value for the kink (72: FIG. 2B) before the mode hop, the lasing mode 84 is located on the slope 86 of the etalon ripple indicated by point A in FIG. 3A. After the mode hop, however, the lasing mode 84 hops to the longer wavelength peak of the etalon's reflection profile, indicated by point B in FIG. 3B. Because the reflectivity of the etalon (54) indicated by point B is higher than that for point A, the output power from the DFB+R laser after the mode hop drops. This explains the drop in the output power in FIG. 2B after the kink 72 caused by the mode hop.

Accordingly, the system 10 of the present disclosure implements a mode stabilization scheme to keep the lasing mode 84 "locked" to avoid a mode hop. In other words, the system 10 maintains the lasing mode 84 on the long wavelength edge 86 of the periodic peak of the reflection profile 80 associated with point A by monitoring a ratio of the output powers from the back and front facets (45, 47) of the DFB+R laser (40) and adjusting the bias signal accordingly to avoid a mode hop associated with point B.

Returning to FIG. 1, the system 10 implements the mode stabilization scheme for the DFB+R laser 40 using the monitor photodiodes 30, 32 located on both back and front facets 45, 47. In essence then, the mode stabilization scheme forms a reference optical filter in the cavity of the DFB+R laser 40 itself. The ratio between the monitored output powers from the back and front facets 45, 47 determines the mode position of the lasing mode on the in-cavity etalon filter's reflection profile, such as on the slope associated with point A in FIG. 3A. Once the mode position 86 is determined, the ratio can then be used to "lock" or maintain the mode position 86. To do this, the control circuitry 20 adjusts the bias signal when the mode 84 shifts away from the mode position 86 to be maintained. For example, shifting of the mode 84 toward the longer wavelength from the optimum mode position 86 associated with point A in FIG. 3A would be evidenced by an increase in the front facet's output power (due to a reduction in the etalon reflectivity) and a decrease in the back facet's output power. Shifting of the mode 84 toward the shorter wavelength from the optimum mode position A in FIG. 3A would be evidenced by an opposite change. Therefore, by monitoring the ratio between the back and front output powers, the mode position on the etalon filter's reflection profile can be detected and stabilized by maintaining the ratio at a constant (or near-constant) value, such as within an acceptable threshold, but adjusting the bias signal provided by the control circuitry 20 to the DFB+R laser 40.

Figure 4:
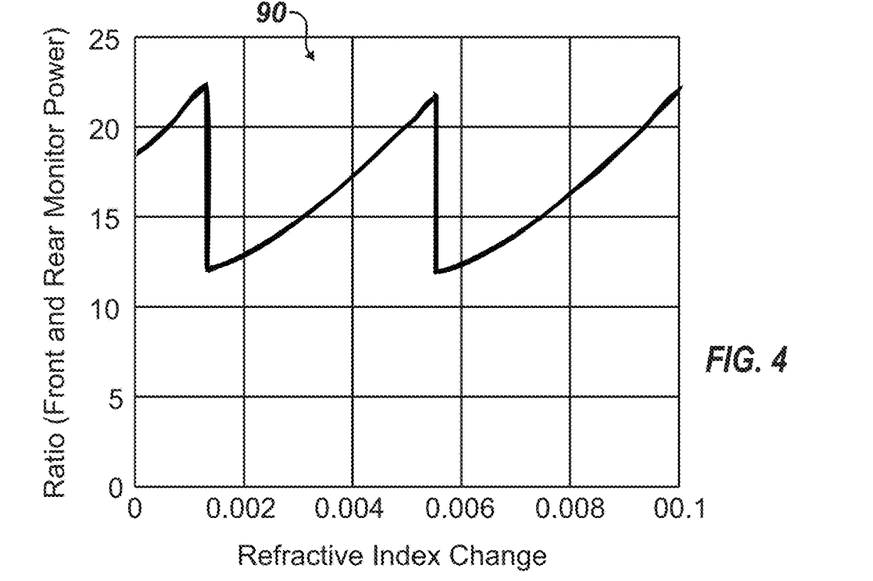
FIG. 4 illustrates a simulation for a front-back power ratio as a function of the refractive index for the MQW gain layer of the DFB+R laser.

FIG. 4 illustrates a simulation for the front-back output power ratio as a function of the refractive index of the laser's MQW gain layer (48). The change in the refractive index occurs due to the Joule heating associated with the bias current provided by the bias contact (55) of the DFB+R laser (40). In this simulated example, the front-back output power ratio reaches a constant value of 22.5 each time a mode hop happens, which corresponds to the periodic changes in the refractive index. The periodic behavior is related to the free-spectral range (FSR) of the etalon filter (54). As this simulation shows, the front-back output power ratio can reach a constant value in relation to when the mode hop occurs, and the Joule heating associated with the bias current provided to the DFB+R laser (40) has an effect.

Figure 5A:
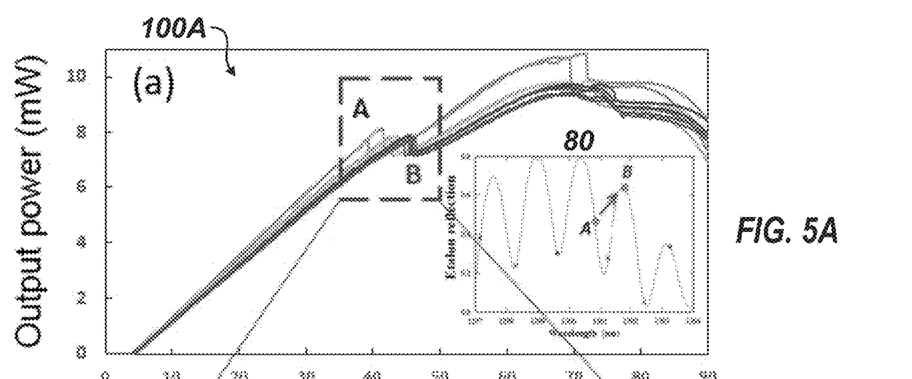
FIG. 5A shows L-I characteristics measured at 25° C. for DFB+R laser used for aging study and stability of FBR during the accelerated aging test from 0 hours to 1150. hours.
Figure 5B:
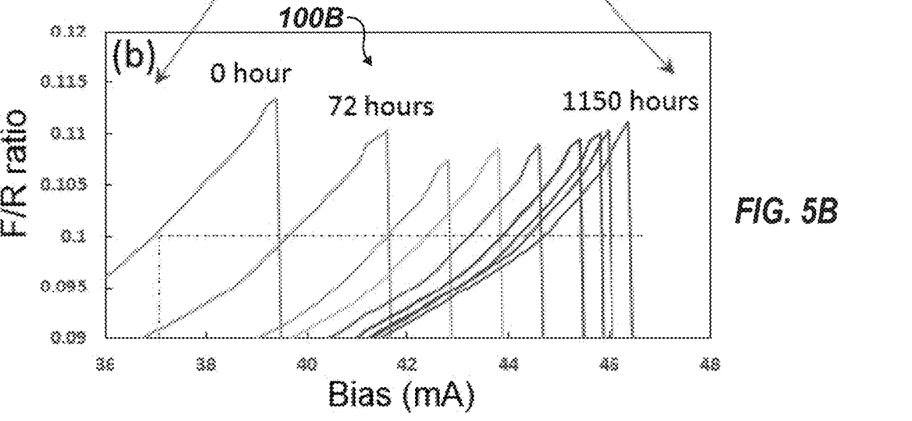
FIG. 5B shows L-I characteristics measured at 25° C. for DFB+R laser used for aging study and stability of FBR during the accelerated aging test from 0 hours to 1150.

Pulling all of this together, discussion turns to FIGS. 5A-5B, which show light-current (L-I) characteristics used for an aging study of a DFB+R laser (40) according to the present disclosure. The aging study indicates the stability of the front-back output power ratio during an accelerated aging test of the laser (40) from 0 hours to 1150 hours.

In particular, FIG. 5A illustrates the L-I characteristics 100A for the DFB+R laser (40) measured at 25° C. showing just the front output power (mW) relative to bias current (mA) during accelerated aging from 0 hours to 1150 hours. The mode hop in this example occurred at about 39.2 mA at 0 hours before the accelerated aging was started. No burn-in was executed. For the accelerated aging, the bias current was kept at 80 mA, and the operating temperature was set at 75° C. The corresponding junction temperature was estimated to be 135° C.

Meanwhile, FIG. 5B illustrates a graph 100B of the front-back output power ratio relative to the bias current (mA) for a focused region during the mode hop from point A to point B. Here, the front-back output power ratio is graphed in a bias range of 30 mA to 50 mA. The dashed line indicates a constant front-back output power ratio.

As the aging test shows, the threshold current increased from about 3.90 mA to about 4.62 mA after 1150 hours of aging. At the same time, the kink bias current increased by about 7.0 mA from about 39.5 mA to about 46.5 mA.

A number of conclusions can be drawn from this aging test about the stability of the DFB+R laser (40) and the bias current to apply based on the monitored front-back output power ratio monitored. For example, a conclusion can be made that the operating bias current can be set to 37 mA, which is 2.0 mA below the kink bias current at 0 hours. If this is done, then the corresponding front-back output power ratio would be 0.1. This indicates that an automatic constant control (ARC) of the control circuitry (20) of the front-back output power ratio can be used at 0.1 after 1150 hours. In this case, the operating bias current will increase to 44.6 mA, which is still 1.9 mA below the kink bias current at 1150 hours. This is a change of the operating bias current relative to the kink bias current only by 0.1 mA.

Looking at the aging for the test in question, the estimated junction temperature at 40 mA bias current is 36° C., which corresponds to an acceleration factor of 1456.9. Using this factor, 1150 hours of accelerated aging corresponds to 191 years of operation of the DFB+R laser (40) at an operating temperature of 25° C. Therefore, based on this aging analysis, the stabilization scheme provided by the disclosed system 10 based on monitoring the front-back output power ratio and adjusting the bias current based on the ratio may be able to guarantee long-term stability of the DFB+R laser (40), when the bias current is maintained close to the mode-hop condition within 2 mA.

The above is just an example of an aging test for a DFB+R laser of the present disclosure under consideration. Other implementations would produce other stabilization schemes based on different values for features of the DFB+R laser, the bias current, operating temperatures, mode hop conditions, aging lengths, etc.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. A controller for a distributed feedback plus reflection (DFB+R) laser, the DFB+R laser having a back facet, a DFB section, a passive section, and a front facet, the passive section, a portion of the DFB section, and the front facet forming an etalon filter, the controller comprising:
a first photodiode being arranged to monitor first output power emitted from the front facet of the DFB+R laser;
a second photodiode being arranged to monitor second output power emitted from the back facet of the DFB+R laser; and
control circuitry in electrical communication with the first and second photodiodes and in electrical communication with the DFB+R laser, the control circuitry being configured to:
directly modulate the DFB section;
bias the passive section;
monitor a ratio of the first output power relative to the second output power; and
adjust the bias based on the monitored ratio.

2. The controller of claim 1, the etalon filter having a reflection profile with periodic peaks and valleys, wherein the control circuitry is configured to operate a lasing mode of the DFB section in a mode position aligned to a long wavelength edge of one of the periodic peaks of the reflection profile of the etalon filter.

3. The controller of claim 2, wherein in monitoring the ratio and adjusting the bias, the control circuitry is configured to maintain the ratio to stabilize the lasing mode in the mode position.

4. The controller of claim 3, wherein to stabilize the mode position, the control circuitry is configured to adjust the bias to be below a value associated with a mode-hop condition in the reflection profile of the etalon filter.

5. The controller of claim 1, wherein the control circuitry comprises:
a modulation contact coupled to the DFB section, the control circuitry being configured to provide a modulation signal to the DFB section to modulate the DFB section; and
a bias contact coupled to a passive section of the DFB laser between the DFB section and the front facet, the control circuitry being configured to provide a bias signal to the passive section.

6. A system, comprising:
a distributed feedback plus reflection (DFB+R) laser having a back facet, a DFB section, a passive section, and a front facet, wherein the passive section, a portion of the DFB section, and the front facet form an etalon filter;
a first photodiode being arranged to monitor first output power emitted from the front facet of the DFB+R laser;
a second photodiode being arranged to monitor second output power emitted from the back facet of the DFB+R laser; and
control circuitry in electrical communication with the first and second photodiodes and the DFB+R laser, the control circuitry being configured to:
directly modulate the DFB section;
bias the passive section;
monitor a ratio of the first output power relative to the second output power; and
adjust the bias based on the monitored ratio.

7. The system of claim 6, wherein the etalon filter has a reflection profile with periodic peaks and valleys; and wherein the control circuitry is configured to operate a lasing mode of the DFB section in a mode position aligned to a long wavelength edge of one of the periodic peaks of the reflection profile of the etalon filter.

8. The system of claim 7, wherein in monitoring the ratio and adjusting the bias, the control circuitry is configured to maintain the ratio to stabilize the lasing mode in the mode position.

9. The system of claim 8, wherein to stabilize the mode position, the control circuitry is configured to adjust the bias to be below a value associated with a mode-hop condition in the reflection profile of the etalon filter.

10. The system of claim 6, wherein the control circuitry comprises:
a modulation contact coupled to the DFB section, the control circuitry being configured to provide a modulation signal to the DFB section to modulate the DFB section; and
a bias contact coupled to a passive section of the DFB laser between the DFB section and the front facet, the control circuitry being configured to provide a bias signal to the passive section.

11. The system of claim 6, wherein the DFB section has a high reflection (HR) element toward the back facet; wherein the passive section has a low reflection (LR) element toward the front facet; wherein the etalon has a reflection profile with periodic peaks and valleys; and wherein the DFB section is configured to operate in a lasing mode aligned to a long-wavelength edge of one of the periodic peaks of the reflection profile of the etalon.

12. The system of claim 11, wherein the LR element comprises:
an LR mirror having a reflectivity of 15% or less;
an LR mirror formed at a front of the passive section; or
an LR coating formed on the front facet of the DFB+R laser.

13. The system of claim 11, wherein the HR element comprises:
an HR mirror having a reflectivity of 30% or more;
an HR mirror coupled to or formed at a rear of the DFB section;
an HR coating formed on the back facet of the DFB+R laser; or
an HR distributed Bragg reflector (DBR) mirror.

14. A method comprising:
directly modulating a distributed feedback plus reflection (DFB+R) laser, the DFB+R laser having a back facet, a DFB section, a passive section, and a front facet, wherein the passive section, a portion of the DFB section, and the front facet form an etalon filter;
measuring first output power emitted from a front facet of the DFB+R laser;
measuring second output power emitted from a back facet of the DFB+R laser;
monitoring a ratio of the first output power relative to the second output power; and
adjusting bias to the DFB+R laser based on the monitored ratio.

15. The method of claim 14, wherein the etalon filter has a reflection profile with periodic peaks and valleys; and wherein directly modulating the DFB+R laser comprising operating a lasing mode of the DFB section in a mode position aligned to a long wavelength edge of one of the periodic peaks of the reflection profile of the etalon filter.

16. The method of claim 15, wherein monitoring the ratio and adjusting the bias comprises stabilizing the lasing mode in the mode position by maintaining the ratio.

17. The method of claim 16, wherein stabilize the mode position comprises adjusting the bias to be below a value associated with a mode-hop condition in the reflection profile of the etalon filter.

18. The method of claim 14, wherein measuring the first output power emitted from the front facet of the DFB+R laser comprises measuring with a first photodiode arranged in optical communication with the front facet; and measuring the second output power emitted from the back facet of the DFB+R laser measuring with a second photodiode arranged in optical communication with the back facet.

19. The method of claim 14, wherein directly modulating the DFB+R laser comprises modulating the DFB section with a modulation signal provided to the DFB section of the DFB+R laser with a modulation contact coupled to the DFB section; and wherein adjusting the bias to the DFB+R laser in response to the comparison comprises providing a bias signal to the passive section of the DFB+R laser with a bias contact coupled to the passive section.

20. The method of claim 14, wherein directly modulating the DFB+R laser comprises:
generating laser light in the DFB section;
coupling the laser light from the DFB section to the passive section having a low reflection (LR) element toward the front facet;
resonating the laser light in the etalon filter formed by the portion of the DFB section, the passive section, and the LR element, the etalon filter having a reflection profile with periodic peaks and valleys; and
operating the DFB section in the lasing mode aligned to a long-wavelength edge of one of the periodic peaks of the reflection profile of the etalon.

21. The method of claim 20, wherein resonating the laser light in the etalon filter comprises:
reflecting the laser light with an LR mirror for the LR element having a reflectivity of 15% or less;
reflecting the laser light with an LR mirror for the LR element formed toward a front of the passive section;
reflecting the laser light with an LR coating for the LR element formed on the front facet of the DFB+R laser; or
reflecting the laser light with an LR distributed Bragg reflector (DBR) for the LR element formed in the passive section.

22. The method of claim 20, wherein reflecting the laser light with the HR element comprises:
reflecting the laser light with an HR mirror for the HR element having a reflectivity of 30% or more;

reflecting the laser light with an HR mirror for the HR element coupled to or formed at a rear of the DFB section; or reflecting the laser light with an HR distributed Bragg reflector (DBR) mirror for the HR element.

\* \* \* \* \*